US006701874B1

(12) United States Patent  
Schultz et al.

(10) Patent No.: US 6,701,874 B1  
(45) Date of Patent: Mar. 9, 2004

(54) METHOD AND APPARATUS FOR THERMAL POWERED CONTROL

(75) Inventors: Michael W. Schultz, Elk River, MN (US); Brent Chian, Plymouth, MN (US); Sybrandus B. V. Munsterhuis, Orono, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/382,050

(22) Filed: Mar. 5, 2003

(51) Int. Cl.[7] .............................................. H01L 35/00
(52) U.S. Cl. ....................... 122/14.2; 431/80; 136/217
(58) Field of Search ........................... 122/14.2, 451.1; 431/80, 236, 237; 136/201, 205, 217, 224

(56) References Cited

U.S. PATENT DOCUMENTS

| | | | |
|---|---|---|---|
| 3,847,350 A | * 11/1974 | Thompson | ................. 237/8 A |
| 4,696,639 A | 9/1987 | Bohan, Jr. | |
| 4,734,658 A | 3/1988 | Bohan, Jr. | |
| 4,770,629 A | 9/1988 | Bohan, Jr. | |
| 4,984,981 A | 1/1991 | Pottebaum | |
| 5,622,200 A | * 4/1997 | Schulze | ....................... 137/66 |
| 5,660,328 A | 8/1997 | Momber | |
| 5,797,358 A | * 8/1998 | Brandt et al. | ............ 122/448.1 |
| 5,975,884 A | * 11/1999 | Dugger | ........................ 431/42 |
| 6,261,087 B1 | 7/2001 | Bird et al. | |
| 6,293,471 B1 | 9/2001 | Stettin et al. | |
| 2001/0031138 A1 | 10/2001 | Troost, IV | |

* cited by examiner

Primary Examiner—Gregory Wilson

(57) ABSTRACT

A system in accordance with the invention includes a thermo-electric device that is physically proximate with a thermal energy source, where, in operation, the thermo-electric device generates a voltage potential. The system further includes a power conversion circuit connected with the thermo-electric device, to modify the generated voltage potential. Also included in the system is a controller circuit connected with the power conversion circuit, where the thermo-electric device powers the controller circuit via the power conversion circuit. The system additionally includes a valve-control circuit connected with the controller circuit and the power conversion circuit, such that the thermo-electric device powers the valve control circuit, at least in part, via the power conversion circuit. The system also includes one or more sensing devices connected with the controller circuit.

31 Claims, 3 Drawing Sheets

METHOD AND APPARATUS FOR THERMAL POWERED CONTROL

FIELD

The present invention relates to gas powered appliances and, more particularly, to gas-powered appliances with thermally powered control systems.

BACKGROUND

Gas-powered appliances typically have some control system included for controlling the operation of the appliance. In this context, a gas-powered appliance may be a water heater, a fireplace insert or a furnace, as some examples. Also in this context, "gas-powered" typically means natural gas or liquid propane gas is used as a primary fuel source. Current control systems used in gas-powered appliances are typically powered by a source external to the appliance, or take the form of a thermo-mechanical system, of which both approaches have certain disadvantages.

In this respect, appliances with external power sources may be difficult to use in certain situations due to availability and/or proximity of a suitable power source. Additionally, such systems typically do not function in the event of a power outage, which is undesirable. While a thermo-mechanical back-up control system may be included in such an appliance, that approach may be overly redundant and cost prohibitive in a commercial application.

Likewise, gas-powered appliances that employ thermo-mechanical controls, while not using an external power supply, also have certain disadvantages. Such thermo-mechanical controls are typically inaccurate due to machining tolerances, mechanical hysteresis and the use of only a single temperature sensing location due the impracticability of multiple sensor configurations. Based on the foregoing, alternative approaches may be desirable.

SUMMARY

A system in accordance with the invention includes a thermo-electric device that is physically proximate with a thermal energy source, where, in operation, the thermo-electric device generates a voltage potential. The system further includes a power conversion circuit connected with the thermo-electric device, to modify the generated voltage potential. Also included in the system is a controller circuit connected with the power conversion circuit, where the thermo-electric device powers the controller circuit via the power conversion circuit. The system additionally includes a valve control circuit connected with the controller circuit and the power conversion circuit, such that the thermo-electric device powers the valve control circuit, at least in part, via the power conversion circuit. The system also includes one or more sensing devices connected with the controller circuit.

BRIEF DESCRIPTION OF THE DRAWINGS

The subject matter regarded as the invention is particularly pointed out and distinctly claimed in the concluding portion of the specification. The invention, however, as to both organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood that the present invention may be practiced without these specific details. In other instances, well-known methods, procedures, components and circuits have not been described in detail, so as not to obscure the present invention.

As was previously indicated, current approaches for control of gas-powered devices, such as appliances, may have certain drawbacks. Again, in this context, gas-powered typically means natural gas or liquid propane gas is employed as a primary fuel source. For the sake of illustration, the embodiments of the invention discussed herein will be described with reference to a water heater appliance. Of course, the invention is not limited in scope to use in a water heater, and other applications are possible. For example, embodiments of the invention may be employed in a gas-powered furnace, a gas-powered fireplace, or any number of other gas-powered devices.

Figure 1:
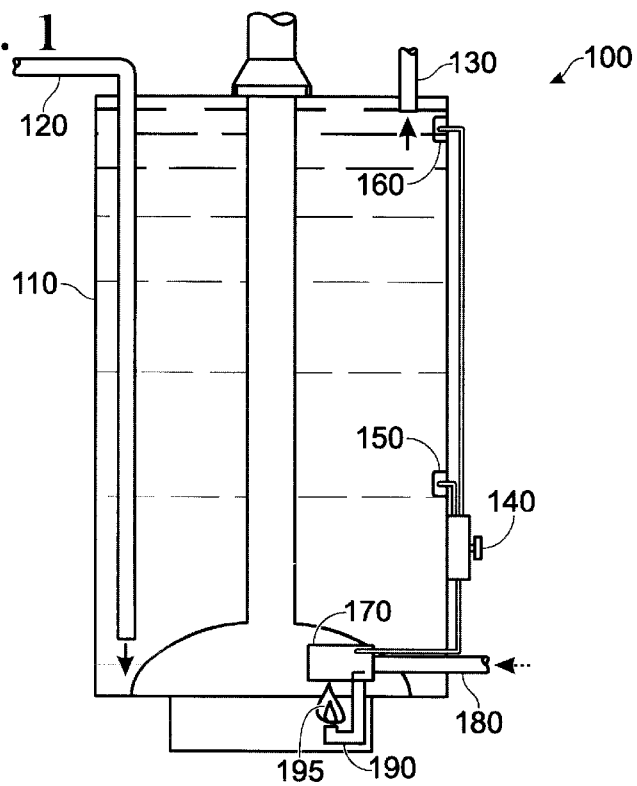
FIG. 1 is a drawing illustrating a water heater according to an embodiment of the invention.

Referring to FIG. 1, a drawing illustrating an embodiment of a water heater 100 in accordance with the invention is shown. Water heater 100 may include a storage tank 110 for storing water that has been, or is to be heated. Water heater 100 may also include a water supply feed pipe (typically cold water) 120, and a hot water exit pipe 130. Additionally, water heater 100 may include a selectable input device/control circuit 140, and temperature sensors 150 and 160. Information, such as water temperature within tank 110 and/or a preferred water temperature may be communicated, respectively, by temperature sensors 150 and 160 and the input device of input device/control circuit 140 to the control circuit of input device/control circuit 140. Typically, such information is communicated using electrical signals. In this regard, a thermo-electric device 170 may power input device/control circuit 140. Temperature sensors 150 and 160 may be located in inside storage tank 110 or, alternatively, may be located on an outside surface of storage tank 110. While the invention will be described in further detail with respect to FIGS. 2–6, briefly, employing a thermally powered control circuit, such as input device/control circuit 140, with water heater 100 overcomes at least some of the foregoing described disadvantages, such as use of external power.

For water heater 100, a gas supply line 180 and a pilot burner/pilot gas valve 190 may also be coupled with input device/control circuit 140. In this regard, burner 190 may produce a pilot flame 195. Thermal energy supplied by pilot flame 195 may be converted to electric energy by thermo-electric device 170. This electrical energy may then be used by thermally powered input device/control circuit 140 to operate water heater 100, as is described in further detail hereinafter. Water heater 100 may further include a main burner/main burner gas valve (not shown), which may provide thermal energy for heating water contained within tank 110.

Figure 2:
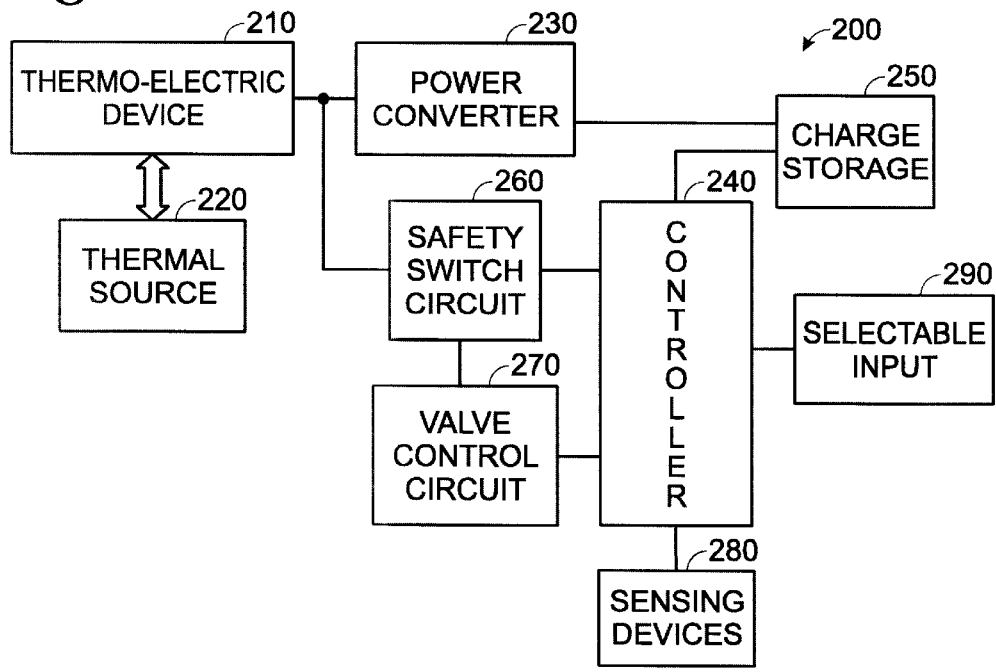
FIG. 2 is a block diagram of a thermally powered control system according to an embodiment of the invention.

Referring to FIG. 2, a block diagram of an embodiment of a thermally powered control system 200 in accordance with the invention is shown. System 200 may be used in water heater 100 as control circuit 170, though the invention is not so limited. Features and aspects of the embodiment shown in FIG. 2 will be discussed briefly with reference to system 200, with a more detailed description of an embodiment of a thermally powered control system in accordance with the invention being set forth below with reference to FIG. 3.

In this regard, system 200 may include a thermo-electric device 210 that is in thermal communication with a thermal source 220. In this context, thermal communication typically means that thermo-electric device 210 and thermal source 220 are in close enough physical proximity with each other, such that thermal energy generated by thermal source 220 may be absorbed by, or communicated to, thermo-electric device 210. In this respect, thermal energy communicated to thermo-electric device 210 from thermal source 220, in turn, may result in thermo-electric device 210 producing an electric voltage potential.

As is shown, thermo-electric device 210 may be coupled with power converter 230. Power converter 230 may modify the voltage potential produced by thermo-electric device 210. Typically, because the voltage potential produced by thermo-electric device 210 is lower than desired for operating most circuit components, power converter 230 may be a step-up power converter, as is discussed in more detail hereinafter. Power converter 230 may be further coupled with a controller 240 and a charge storage device 250. While the invention is not limited in scope to the use of any particular controller, controller 240 may take the form of an ultra-low power microcontroller. Such microcontrollers are available from Texas Instruments, Inc., 12500 TI Boulevard, Dallas, Tex. 75243 as the MSP430 product family, though, as previously indicated, alternatives may exist. Charge storage device 250 may comprise circuit components, such as capacitors, for example, to store charge for use by controller 240, and also for stepping up the voltage potential generated by thermo-electric device 210, as is discussed further below.

System 200 may also include a safety switch circuit 260 coupled with thermo-electric device 210 power converter 230, controller 240, and a valve control circuit 270. For this particular embodiment, safety switch circuit 260 may close any open valves associated with valve control circuit 270 as a result of controller 240 ceasing to toggle an output signal associated with safety switch circuit 260. Such a situation may indicate failure of controller 240. Additionally, controller 240 may include machine readable instructions that, when executed, may result in safety switch 260 closing any open valves as part of a system shut down sequence. Valve control circuit 270 may be further coupled with controller 240, such that controller 240 may initiate opening and closing of one or more gas valves associated with valve control circuit 270, as is discussed further below. Methods that may be executed by controller 240, for example are described in commonly owned Patent Application No. 10/382,056, Honeywell docket number H0003053, the entire disclosure of which is incorporated by reference herein.

System 200 may still further include one or more sensing devices 280 and an input selection device 290, which may be coupled with controller 240. Sensing devices 280 may take the form of negative-temperature-coefficient (NTC) device, which, for the embodiment illustrated in FIG. 1, may sense water temperature within storage tank 110. Controller 240 may then compare information received from sensing devices 280 with a threshold value that is based on a setting of selection device 290. Based on this comparison, controller 240 may initiate opening a main burner valve to heat water within a hot water heater. Alternatively, for example, controller 240 may initiate closing a main burner valve to end a heating cycle in a water heater. As was previously indicated, the invention is not limited to use with a water heater, and may be used in other applications, such as with furnaces or fireplaces. In such applications, sensing devices 280 may sense room temperature, as opposed to water temperature.

Figure 3:
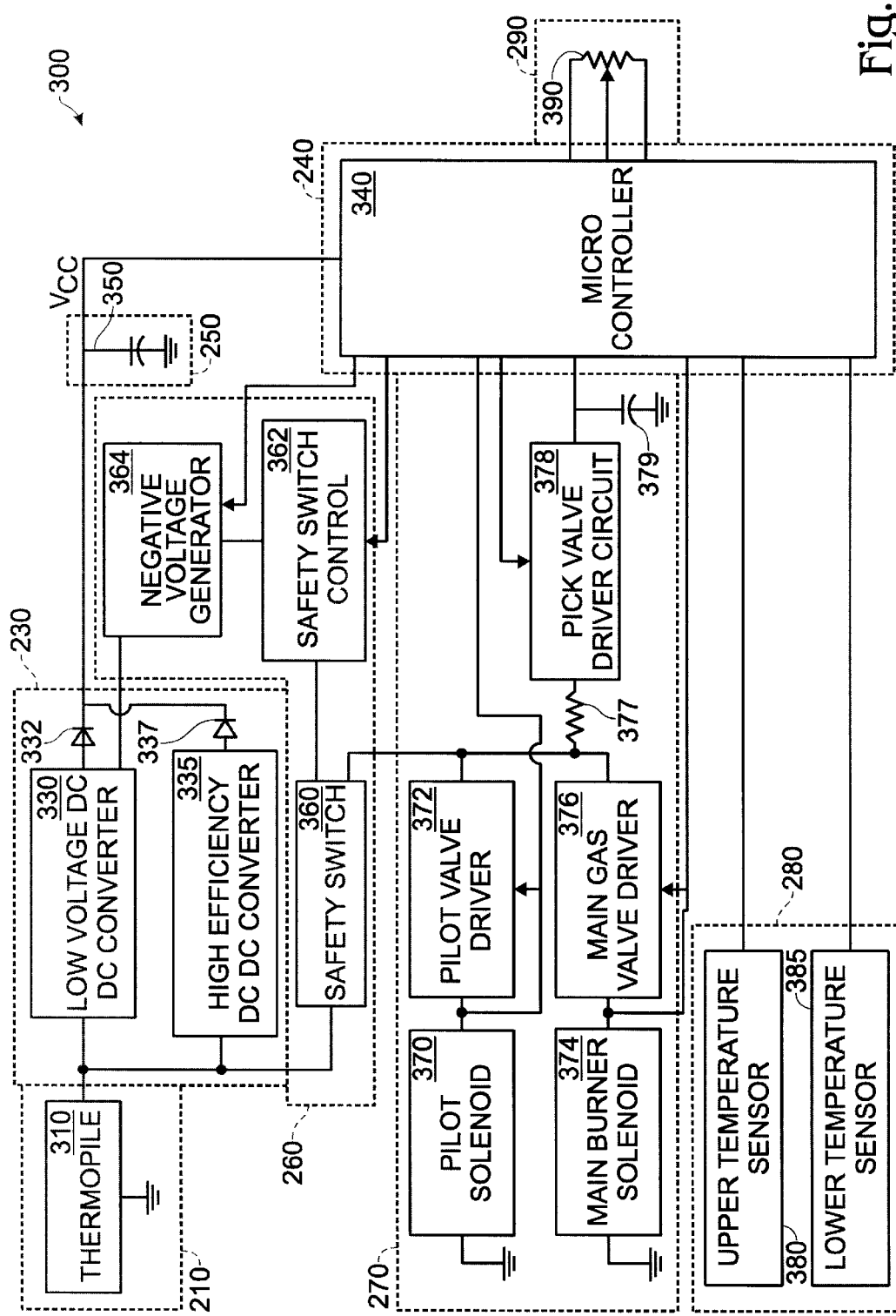
FIG. 3 is a more detailed block/schematic diagram of the system shown in FIG. 2.

Referring now to FIG. 3, a more detailed block/schematic diagram of a thermally powered control system in accordance with the invention is depicted. For comparison purposes. FIG. 3 has the individual blocks of FIG. 2 indicated by their reference numbers and enclosed in dot-dashed lines. It is to be understood that these references are merely illustrative and do not in anyway limit the scope of the invention as numerous approaches for the various portions of FIGS. 2 and 3 are possible. Furthermore, for brevity, specific details discussed with reference to FIG. 2 above may not be repeated with reference to FIG. 3.

For this embodiment, thermo-electric device 210 may take the form of thermopile 310. As is known, a thermopile typically includes plural thermocouples connected in series. Such a configuration may allow for greater sensitivity to thermal energy. For this specific application, it may provide for higher voltage potential being produced. Typically, thermopile 310 may generate a voltage potential in the range of one hundred to five hundred millivolts when in thermal communication with a pilot burner, for example. Alternatively, thermo-electric device 210 could take the form of a single thermocouple, or any other thermo-electric device capable of producing voltage potentials in the above-indicated range.

Thermopile 310 may be coupled with power converter 230. For this embodiment, power converter 230 may take the form of a two-stage direct-current voltage to direct-current voltage converter (DC-DC converter), which comprises a low voltage DC-DC converter 330, a high efficiency DC-DC converter 335 and blocking diodes 332 and 337. Such two-stage DC-DC converters are described in commonly owned Patent Application No. 10/382,203, Honeywell docket number H0004032, the entire disclosure of which is incorporated by reference herein.

Briefly, low voltage DC-DC converter 330 would initially begin converting the voltage potential generated by thermopile 310, such as when a pilot burner is initially lit. Converted voltage potential may be stored on charge storage device 250, which may take the form of capacitor 350 for this embodiment. Once low voltage DC-DC converter 330 has established a sufficient voltage to enable reliable operation of controller 240, which may take the form of microcontroller 340, low-voltage DC-DC converter 330 may be disabled by microcontroller 340. Contemporaneously, microcontroller 340 may enable high efficiency DC-DC converter 335 for further converting the voltage potential generated by thermopile 310.

Once high-efficiency DC-DC converter 335 has established a desired operating voltage, typically three volts, safety switch circuit 260 may be place in its normally closed state. Safety switch circuit 260, for this particular embodiment may comprise safety switch 360, safety switch control 362 and negative voltage converter 364. As shown in FIG. 3, safety switch 260 may be coupled with thermopile 310, low voltage DC-converter 330, high efficiency DC-DC converter 335 and microcontroller 340. Such safety switch apparatus are described in commonly owned Patent Application No. 10/424,257, Honeywell docket number H0004012, the entire disclosure of which is incorporated by reference herein.

Briefly, safety switch 360 may comprise a field-effect transistor (FET), the gate of which is coupled with safety switch control 362. Negative voltage generator 364 may be a charge pump circuit that biases safety switch control 362, during operation, such that safety switch 360 remains in a normally closed state, which may allow voltage from thermopile 310 to be transmitted through safety switch 360. Negative voltage generator 364 typically operates based on an electrical signal of a substantially predetermined duty cycle, which may be generated by microcontroller 340 for this embodiment. Should microcontroller 340 cease to generate such signal, negative voltage generator 364 may cease to function, causing safety switch 360 to open. Such a configuration is desirable as it may shut down a system, such as a water heater, in the event of failure of microcontroller 340.

Alternatively, microcontroller 340 may execute machine-readable instructions (software) that cease to generate the electrical signal to negative voltage generator 364. Microcontroller 340 may then communicate an electrical signal to safety switch control 362, which may result in safety switch 360 opening-more rapidly by, for example, discharging the gate of a FET. Such an approach may be employed as part of a system shut down sequence for embodiments in accordance with the invention.

In this regard, safety switch 360 (safety switch circuit 260) may be coupled with valve control circuit 270. Valve control circuit 270 may comprise pilot operator 370, pilot valve driver 372, main operator 374, main valve driver 376 and pick valve driver circuit 378. Additionally valve control circuit 27(0 may comprise resistor 377 and capacitor 379, which may function, respectively, to limit current and provide a voltage well for picking the pilot valve 370 or main valve 374. In this context, picking a valve means firing an operator to open the valve. Because picking current is typically higher than the current to hold a valve open, such a configuration may provide additional current for such an operation. Such valve-picking configurations are described in more detail in commonly owned Patent Application No. 10/456,110, Honeywell docket number H0004040, the entire disclosure of which is incorporated by reference herein, and will not be discussed further here.

For this embodiment, sensing devices 280 may take the form of an upper temperature sensor 380 and a lower temperature sensor 385, which may be included in a water heater storage tank, such as shown in FIG. 1. The invention is, of course, not limited in scope in this respect, as sensing devices 280 may take other forms, such as room temperature sensors, as was previously indicated. Sensors 380 and 385 may be coupled with microcontroller 340, which may receive information about water temperature from them. The information received by microcontroller 340 from sensors 380 and 385 may be compared with an input device selection received from input selection device 290. For this embodiment, input selection device 290 may take the form of a potentiometer 390. However, input selection device 290 may take other forms, such a digital input keypad for entering a desired heating temperature. Of course, many other alternatives exist.

As an alternative to comparing the information received from sensors 380 and 385 directly with the setting selected on potentiometer 390, microcontroller 340 may establish two or more thresholds with which such information may be compared. In this respect, microcontroller 340 may establish a first threshold that is some value below the input selection indicated and second threshold some value above the input selection. In this scenario, the first threshold may be used to indicate, for example, that further heating of water in storage tank 110 is desired, and microcontroller 340 may communicate with valve control circuit 270 to pick main valve driver 376/main valve operator 374. Likewise, the second threshold may be used to indicate that water in storage tank 110 is sufficiently heated, and microcontroller 340 may again communicate with valve control circuit 270 to close main valve operator 374.

Figure 4:
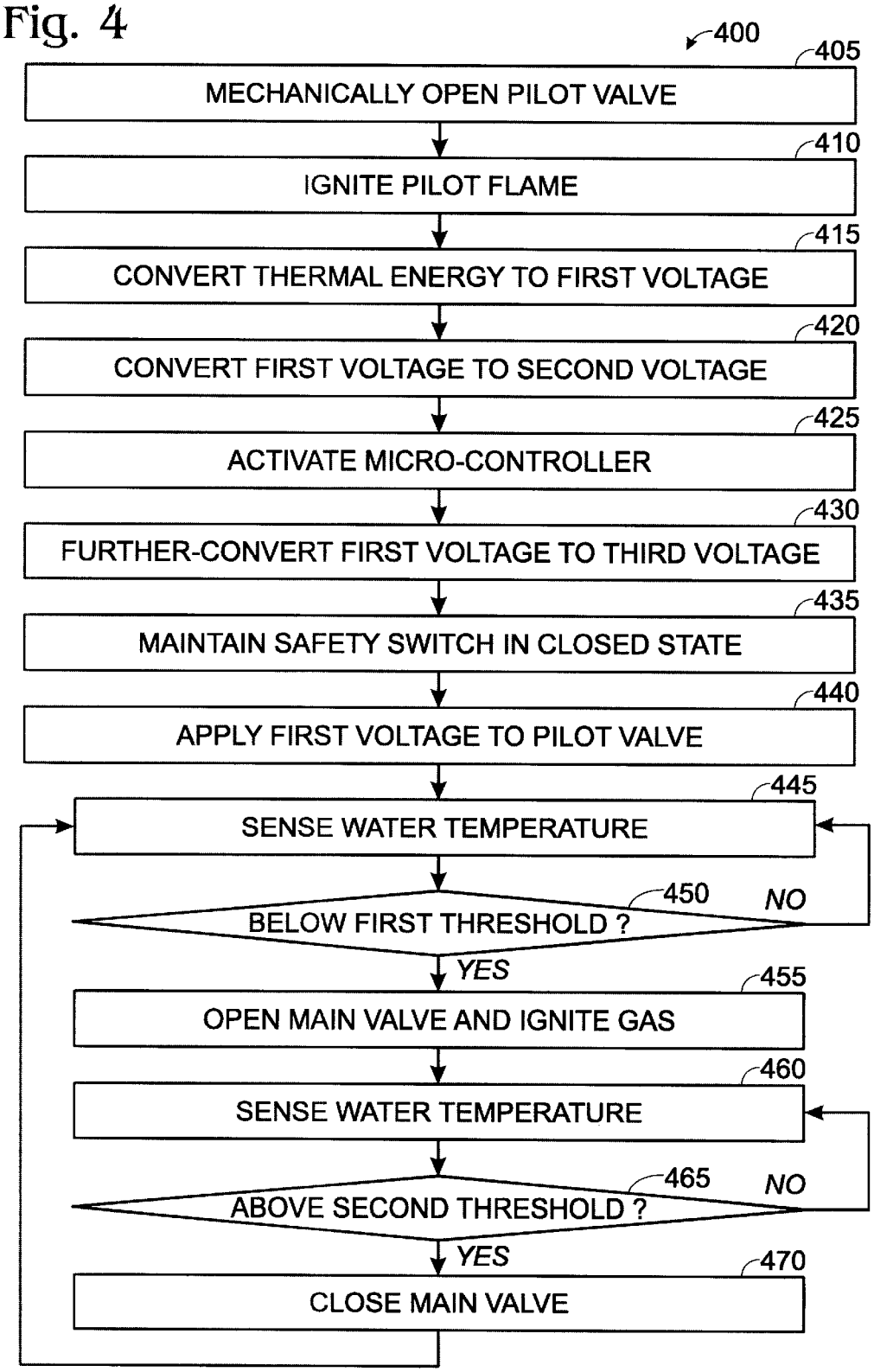
FIG. 4 is a flow chart illustrating a method of controlling a gas powered appliance according to an embodiment of the invention.

A method 400 in accordance with the invention will now be described with reference to FIG. 4, and with additional reference to FIGS. 1–3. Method 400 may comprise applying thermal energy to a thermo-electric device by mechanically opening a pilot gas valve at block 405, and igniting gas emitted from the pilot gas valve at block 410. Thermal energy from the ignited gas may then be used by the thermo-electric device to generate a first voltage potential at block 415. This first voltage potential may then be converted to a second voltage potential at block 420, using previously described approaches. Once the second voltage potential reaches a threshold at which, for example, microcontroller 340 may operate, microcontroller 340 may be activated using the second voltage potential at block 425.

Further conversion of the first voltage potential to a third voltage potential using a second DC-DC converter may be accomplished at block 430, using techniques described above. Safety switch 360 may be put in its normally closed state at block 435, and the first voltage potential may be applied to a gas valve, such as pilot gas valve driver 372, at block 440. At block 445, temperature of water within storage tank I 10 may then be sensed using sensors 380 and 385 and compared with a first threshold, as had been previously discussed, at block 450. If such a comparison indicates that additional heating is desired, main valve driver 376/main operator 374 may be picked at block 455. Gas emitted from the main gas valve is typically ignited by the pilot burner, as is known. Again, water temperature may be sensed at block 460 and once that temperature has exceeded a second threshold, as discussed above, at block 465, main operator 374 may then be closed at block 470. The heating cycle, blocks 445 to 475, may then be repeated. Again, the invention is not limited in scope to use in a water heater, and methods in accordance with the invention may used in other applications, as has been previously indicated.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A system comprising:
   a thermo-electric device in thermal communication with a first gas burner, wherein, in operation, the thermo-electric device generates a voltage potential;
   a power conversion circuit coupled with the thermo-electric device for modifying, at least in part, the generated voltage potential;
   a controller circuit coupled with the power conversion circuit, wherein the thermo-electric device powers the controller circuit via the power conversion circuit;
   a valve control circuit coupled with the controller circuit and the power conversion circuit, wherein the thermo-electric device powers the valve control circuit, at least in part, via the power conversion circuit; and one or more sensing devices coupled with the controller circuit.

2. The system of claim 1, wherein the thermo-electric device comprises at least one thermocouple device.

3. The system of claim 1, wherein the thermo-electric device comprise a thermopile device.

4. The system of claim 1, wherein the first gas burner is a natural gas burner.

5. The system of claim 1, wherein the gas burner is a liquefied petroleum gas burner.

6. The system of claim 1, wherein the first gas burner is a pilot burner included in a water heater.

7. The system of claim 1, wherein the voltage potential is at least one hundred millivolts.

8. The system of claim 1, wherein the power conversion circuit is a direct-current voltage to direct-current voltage converter (DC—DC converter).

9. The system of claim 8, wherein the DC—DC converter comprises a two-stage DC—DC converter including a low voltage DC—DC converter first stage coupled with the thermo-electric device and the controller; and a high efficiency DC—DC converter second stage coupled with the thermo-electric devices the first stage, and the controller.

10. The system of claim 1, wherein the valve control circuit comprises a first operator driver for operating a first valve associated with the first gas burner;

a second operator driver for operating a second valve associated with a second gas burner; and a valve picking driver circuit for supplying, at least a portion of, a picking current to at least one of the first operator driver and the second operator driver.

11. The system of claim 1, wherein the one or more sensing devices comprise temperature sensors.

12. The system of claim 11, wherein the temperature sensors comprise water temperature sensors included in, or mounted on the surface of, a storage tank in a water heater.

13. The system of claim 1, further comprising a safety switch circuit coupled with the thermo-electric device, the power converter circuit, the valve control circuit and the controller, such that the safety switch circuit will close one or more open valves associated with the valve control circuit as a result of the controller ceasing to toggle an output signal associated with the safety switch circuit.

14. The system of claim 1, further comprising an input selection device coupled with the controller for establishing an operating target, wherein the operating target is compared, by the controller, with electronic information received from the one or more sensors as a basis for controlling one or more valves associated with the valve control circuitry.

15. The system of claim 14, wherein the input selection device comprises a potentiometer for selecting a preferred water temperature for a water heater.

16. The system of claim 1, further comprising a charge storage capacitor coupled with the power conversion circuit and the controller for, at least in part, supplying transient current to the controller and a valve picking circuit.

17. A thermally powered control system comprising:
a thermo-electric device;
a first voltage converter coupled with the thermo-electric device;
a second voltage converter coupled with the first voltage converter and the thermo-electric device;

a charge storage capacitor coupled with the first and second voltage converters;

a safety switch apparatus coupled with the thermo-electric device, and the first and second voltage converters;

a valve control apparatus coupled with the safety switch;

a programmable controller coupled with the valve control apparatus, the safety switch apparatus, the first and second voltage converters, and the charge storage capacitor;

one or more temperature sensors coupled with the programmable controller; and a variable input apparatus coupled with the programmable controller, wherein the control system operates based, at least in part, on a setting of the input apparatus and resistive electrical properties of the one or more temperature sensors, and the control system is powered by the thermo-electric device and via the first and second voltage converters, by converted thermal energy communicated to the thermo-electric device.

18. The control system of claim 17, wherein the thermo-electric device is a thermopile device.

19. The control system of claim 17, wherein the first voltage converter is a low voltage direct-current voltage converter that is operable at approximately 100 millivolts.

20. The control system of claim 19, wherein the second voltage converter, relative to the first converter, is a high efficiency, low voltage, direct-current voltage converter having an efficiency at least 20 percent higher than that of the first converter.

21. The control system of claim 17, wherein the safety switch apparatus comprises a normally closed, in operation, switch device;

a biasing circuit for maintaining the switch device in the normally closed state; and a discharge circuit for opening, the switch device based, at least in part, on an electrical signal communicated from the programmable controller to the discharge circuit.

22. The control system of claim 17, wherein the valve control apparatus comprises a first operator driver for operating a first gas valve; and a second operator driver for operating a second gas valve; and a valve picking driver circuit for supplying, at least a portion of, a picking current to at least one of the first operator driver and the second operator driver based on electrical signals communicated from the programmable controller to the valve control apparatus.

23. The control system of claim 17, wherein the programmable controller comprises a programmable microcontroller device, which, in operation, consumes less than one milliwatt.

24. The control system of claim 17, wherein the temperature sensors comprise water temperature sensors included in a water heater storage tank.

25. The control system of claim 17, wherein the variable input apparatus comprises a temperature selection apparatus for selecting a preferred heating temperature for a gas powered water heater.

26. A method comprising:
applying thermal energy to a thermo-electric device;
generating a first voltage potential from the thermal energy using the thermo-electric device;
converting the first voltage potential to a second voltage potential using a first direct-current voltage converter (DC-DC converter);

activating a programmable micro-controller using the second voltage potential; and further converting the first voltage potential to a third voltage potential using a second DC-DC converter.

27. The method of claim 26, wherein applying the thermal energy comprises mechanically opening a first gas valve; and igniting gas emitted from the first gas valve.

28. The method of claim 27, further comprising communicating electrical signals from the programmable micro-controller to a valve control circuit and, as a result, applying the first voltage potential to the first gas valve, so as to supply current to hold the gas valve open.

29. The method of claim 28, maintaining a safety switch in a closed state based, at least in part, on electrical signals communicated from the programmable micro-controller to a safety switch apparatus including the safety switch, such that the first voltage potential is applied to the first gas valve via the safety switch.

30. The method of claim 27, further comprising sensing a temperature of a substance to be heated;

comparing that temperature with a first threshold, the first threshold being based on a preferred temperature;

opening a second gas valve if the sensed temperature is below the first threshold;

igniting gas emitted from the second gas valve using ignited gas from the first valve; and holding the second gas valve open to heat the substance while the sensed temperature is below a second threshold, the second threshold being further based on the preferred temperature.

31. The method of claim 30, wherein the substance to be heated is water contained within a water heater storage tank.

* * * * *